United States Patent
Bretl et al.

(10) Patent No.: US 6,698,092 B2
(45) Date of Patent: Mar. 2, 2004

(54) METHODS AND SYSTEMS FOR FORMING A DIE PACKAGE

(75) Inventors: Frank J. Bretl, Corvallis, OR (US); Gary Powell, Albany, OR (US); Donald L. Michael, East Monmouth, OR (US); Jefferson P. Ward, Brush Prairie, WA (US); Joseph E. Scheffelin, Poway, CA (US); Mohammad Akhavain, Escondido, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 65 days.

(21) Appl. No.: 10/001,679

(22) Filed: Oct. 31, 2001

(65) Prior Publication Data

US 2003/0081647 A1 May 1, 2003

(51) Int. Cl.[7] .................................................. H05K 3/30
(52) U.S. Cl. .......................... 29/841; 29/825; 29/832; 29/840; 347/65; 347/203
(58) Field of Search .............................. 29/890.1, 417, 29/846, 841; 347/65, 203

(56) References Cited

U.S. PATENT DOCUMENTS

| 4,504,845 | A | * | 3/1985 | Kattner et al. |
| 5,697,144 | A | * | 12/1997 | Mitani et al. |
| 6,041,501 | A | * | 3/2000 | Suzuki et al. |
| 6,261,502 | B1 | | 7/2001 | Herbst ........................ 264/275 |
| 6,494,566 | B1 | * | 12/2002 | Kishino et al. |

FOREIGN PATENT DOCUMENTS

GB    2189746 A   * 11/1987

* cited by examiner

Primary Examiner—Carl J. Arbes

(57) ABSTRACT

The described embodiments relate to methods and systems for forming die packages. In one exemplary embodiment, the method for forming die packages contacts interface areas of a die assembly to keep the interface areas free of an insulative material. The method distributes a flowable insulative material around portions of the die assembly.

2 Claims, 8 Drawing Sheets

METHODS AND SYSTEMS FOR FORMING A DIE PACKAGE

BACKGROUND OF THE INVENTION

Electrical devices have become ubiquitous in society and have assumed many forms. Many of the most commonly encountered devices include portable or notebook computers, cell phones, personal digital assistants (PDAs), printers, hand held computer games, and the like. Technological advancements have allowed these devices to provide many previously unimagined conveniences. Users have come to expect more and more from these devices, such as being smaller, faster, and more durable. Also, users expect to be able to use the devices under adverse conditions. Though these devices are used in a myriad of environments, one commonality remains, the components, especially electrical components, must be protected from contamination and corrosion. Sources of contamination include external sources such as water splashing on a cell phone and/or internal sources such as a printer's own ink.

Many of these devices use similar components such as printed circuit boards, integrated circuits, and die. The components are often used in combination by connecting two or more components and then providing electrical insulation and corrosion resistance to the individual connections. The previous methods have proved unsatisfactory both in cost and performance.

Accordingly, the present invention arose out of a desire to provide an economical, easily manufactured way of protecting components of an electrical device.

SUMMARY OF THE INVENTION

The described embodiments relate to methods and systems for forming die packages. In one exemplary embodiment, the method for forming die packages contacts interface areas of a die assembly to keep the interface areas free of an insulative material. The method distributes a flowable insulative material around portions of the die assembly. The method further exposes the flowable insulative material to conditions effective to render the flowable insulative material to a generally non-flowable state.

In another embodiment, a die package comprises a die assembly that has interface areas. The die package also includes a material molded around less than an entirety of the die assembly, and wherein the interface areas are free of the material.

BRIEF DESCRIPTION OF THE DRAWINGS

The same components are used throughout the drawings to reference like features and components.

DETAILED DESCRIPTION OF THE PREFERRED EMBODIMENT

Overview

The embodiments described below pertain to die packages and methods of forming die packages. The illustrated embodiments can combine a die assembly and an insulative component to provide a resultant die package. As used herein a "die assembly" can include, but is not limited to, one or more electrically coupled die, printed circuit boards, and/or integrated circuits. The insulative component can comprise any suitable material and can be formed around portions of the die assembly. Suitable insulative components can provide electrical insulation and/or corrosion resistance to the die assembly. Some other portions of the die assembly, including interface areas, can be kept free from the insulative component. The interface areas can allow electrical and/or fluid handling connections to be made with the die assembly. The insulative component can be distributed around the die assembly in a generally flowable state. The insulative component can then be rendered into a generally non-flowable state that can provide electrical insulation, corrosion resistance, and mechanical stabilization to the die assembly. The finished die package can desirably provide a seamless integrated unit that allows various interface area(s) to be exposed as desired.

The exemplary embodiments described herein are described in the context of providing die packages for use in ink jet printers, however it is recognized and understood that the embodiments are equally applicable to other applications as well.

The various components described below may not be illustrated accurately as far as their size is concerned. Rather, the included figures are intended as diagrammatic representations to illustrate to the reader various inventive principles that are described herein.

Exemplary Printer System

Figure 1:
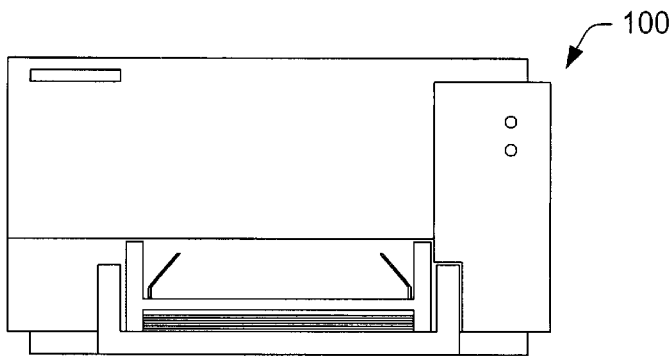
FIG. 1 is a front elevational view of an exemplary electrical device.

FIG. 1 shows a printer 100, embodied in the form of an inkjet printer. The printer 100 can be, but need not be, representative of an inkjet printer series manufactured by the Hewlett-Packard Company under the trademark "DeskJet". The inkjet printer 100 is capable of printing in black-and-white and in color. The term "printer" refers to any type of printer or printing device which ejects ink or other pigmented materials onto a print media. Though an inkjet printer is shown for exemplary purposes, it is noted that aspects of the described embodiments can be implemented in other forms of printing devices that employ inkjet printing elements or other ink ejecting devices, such as facsimile machines, photocopiers, and the like.

Figure 2:
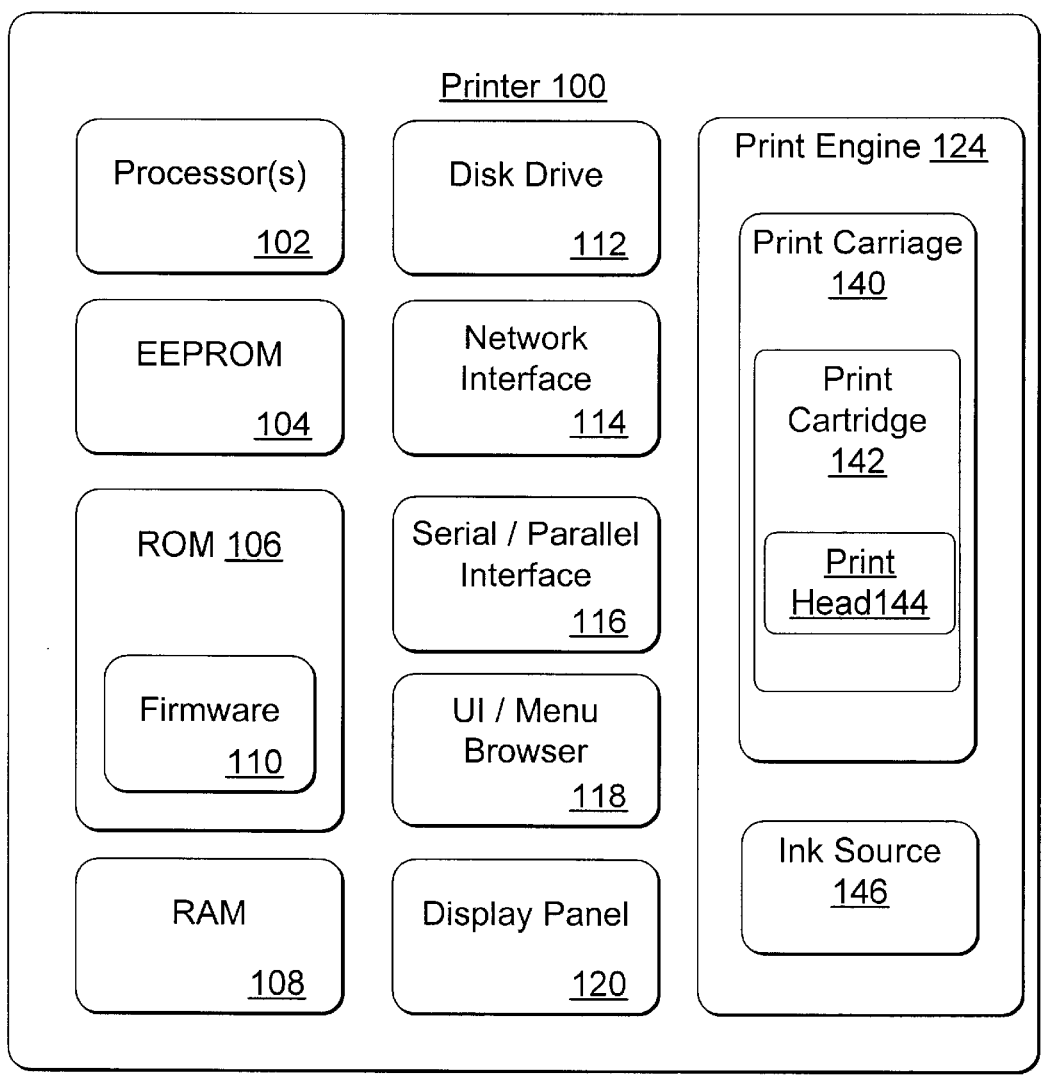
FIG. 2 is a block diagram that illustrates various components of an exemplary electrical device.

FIG. 2 illustrates various components of printer 100 that can be utilized to implement the inventive techniques described herein. Printer 100 can include one or more processors 102. The processor 102 controls various printer operations, such as media handling and carriage movement for linear positioning of the print head over a print media (e.g., paper, transparency, etc.).

Printer 100 can have an electrically erasable programmable read-only memory (EEPROM) 104, ROM 106 (non-erasable), and a random access memory (RAM) 108. Although printer 100 is illustrated having an EEPROM 104 and ROM 106, a particular printer may only include one of the memory components. Additionally, although not shown, a system bus typically connects the various components within the printing device 100.

The printer 100 can also have a firmware component 110 that is implemented as a permanent memory module stored on ROM 106. The firmware 110 is programmed and tested like software, and is distributed with the printer 100. The firmware 110 can be implemented to coordinate operations of the hardware within printer 100 and contains programming constructs used to perform such operations.

Processor(s) 102 process various instructions to control the operation of the printer 100 and to communicate with other electronic and computing devices. The memory components, EEPROM 104, ROM 106, and RAM 108, store various information and/or data such as configuration information, fonts, templates, data being printed, and menu structure information. Although not shown, a particular printer can also include a flash memory device in place of or in addition to EEPROM 104 and ROM 106.

Printer 100 can also include a disk drive 112, a network interface 114, and a serial/parallel interface 116. Disk drive 112 provides additional storage for data being printed or other information maintained by the printer 100. Although printer 100 is illustrated having both RAM 108 and a disk drive 112, a particular printer may include either RAM 108 or disk drive 112, depending on the storage needs of the printer. For example, an inexpensive printer may include a small amount of RAM 108 and no disk drive 112, thereby reducing the manufacturing cost of the printer.

Network interface 114 provides a connection between printer 100 and a data communication network. The network interface 114 allows devices coupled to a common data communication network to send print jobs, menu data, and other information to printer 100 via the network. Similarly, serial/parallel interface 116 provides a data communication path directly between printer 100 and another electronic or computing device. Although printer 100 is illustrated having a network interface 114 and serial/parallel interface 116, a particular printer may only include one interface component.

Printer 100 can also include a user interface and menu browser 118, and a display panel 120. The user interface and menu browser 118 allows a user of the printer 100 to navigate the printer's menu structure. User interface 118 can be indicators or a series of buttons, switches, or other selectable controls that are manipulated by a user of the printer. Display panel 120 is a graphical display that provides information regarding the status of the printer 100 and the current options available to a user through the menu structure.

Printer 100 also includes a print engine 124 that includes mechanisms arranged to selectively apply ink (e.g., liquid ink) to a print media such as paper, plastic, fabric, and the like in accordance with print data corresponding to a print job.

The print engine 124 can comprises a print carriage 140, one or more print cartridges 142, and one or more print heads 144 contained in the print cartridges. Additionally, the print engine can comprise one or more ink sources 146 for providing ink to the print cartridges and ultimately to a print media via the print heads.

Exemplary Embodiment

Figure 3:
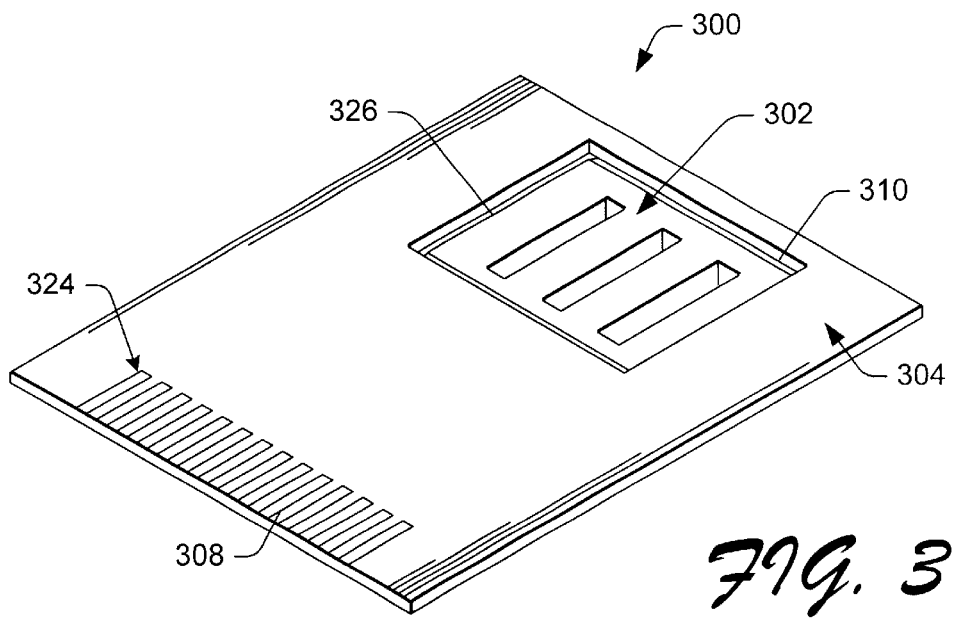
FIG. 3 is a perspective view in accordance with one exemplary embodiment.
Figure 3A:
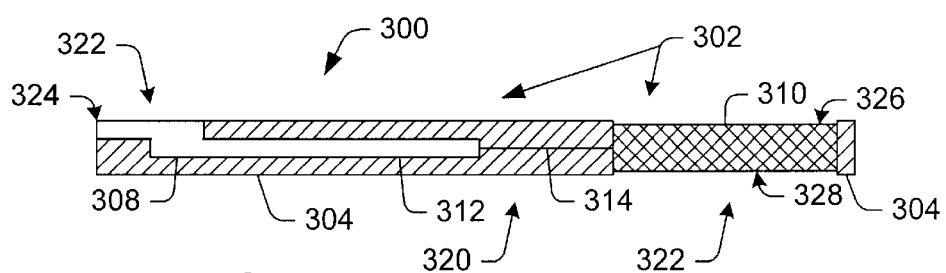
FIG. 3a is a cross-sectional representation in accordance with one exemplary embodiment.
Figure 4:
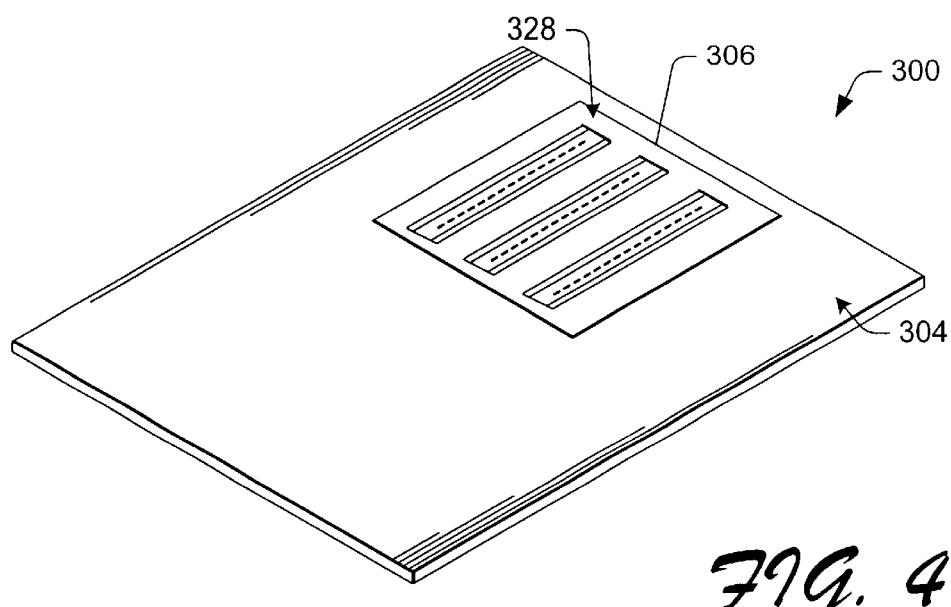
FIG. 4 is a perspective view in accordance with one exemplary embodiment.

FIG. 3 shows an exemplary embodiment of a die package 300 that comprises a die assembly 302 surrounded by an insulative component 304. FIG. 3a is a cross-sectional representation of the embodiment shown in FIG. 3 and can help to illustrate more clearly the die package 300. FIG. 4 shows the opposite side of the die package as shown in FIG. 3. Looking now at FIG. 3a, the die assembly 302 comprises a die 310 and a printed circuit board (PCB) 312. These two components are coupled by a conductor 314. It can further be seen that areas or portions of the die assembly 302 are covered by insulative component 304, while other areas are uncovered. The covered areas are shown generally at 320, and the uncovered areas are shown generally at 322. The uncovered areas can comprise interface areas. More specifically, in this embodiment, area 324 can be used as an electrical interface, while areas 326 and 328 can be used as fluid interfaces.

As described, electrical interface area 324 can be used for coupling the die package to other electrical components such as the processor 102. Fluid interface area 326 can be used to receive ink from an ink supply into the die package, and fluid interface area 328 can be used for ejecting ink onto a print media in an ink jet printer. Alternatively, in various embodiments, the interfaces can be used for coupling the die package to switches, keypads, and various other components and devices to name just a few.

The interface areas can be kept free of insulative materials comprising the insulative component by contacting, or otherwise physically blocking these areas from being covered by the insulative material when such material is distributed around the die assembly. Among many possible ways, this can be achieved when a die assembly is placed in a mold. If a mold is used, then those areas that are contacted can be blocked or "shut off" from the insulative material. This will be discussed in more detail in relation to FIGS. 9 and 10.

A die package constructed in this manner from a die assembly and an insulative component can provide seamless protection from corrosion. Previously, PCBs, die, and the like were connected with insulated conductors such as flex, and then layers of protective coatings or films were layered or laminated on top of the flex and the various components to provide protection. However, this type of construction is expensive and susceptible to quality control problems. The area where the flex connects to the electrical component is subject to leakage and short circuiting. This can be due to corrosive material such as ink getting between the layers and causing corrosion and degradation of the components. Commonly, the corrosion begins at or along the connections between various components such as a die and a PCB. When the connectors pass through the laminations it causes that area to be subject to contamination and subsequent delamination allowing ink and servicing fluids, etc. to corrode the components.

In some of the exemplary embodiments, the connections of the die assembly can be entirely contained within the die package. This can eliminate the most susceptible areas of a die package. Alternatively, some exemplary embodiments can keep desired interface areas exposed and once the proper interface is completed traditional sealing methods can be used to further protect the die package and related connections. For example, FIG. 5 has an electrical interface area 324. An electrical connector (not shown) can be connected to or otherwise coupled with the electrical interface and then the electrical connection can be protected using potting or laminating as is known in the prior art.

In still other embodiments, once the connection is made to the exposed interface area, the entire die package can be protected by molding or otherwise flowing an insulative material around it as described above. This can allow the advantages of the flowable insulative component to connections and other interfaces that are completed after the initial molding process. Thus, in some embodiments a die package can be sequentially constructed. For example, a PCB can be configured as desired and placed in a mold having a configuration that blocks off desired interface areas of the PCB. After molding, one or more die can be connected via the interfaces, and then the entirety can be placed in a mold and be at least partially embedded in, or surrounded by, insulative material. In some embodiments, this can be repeated multiple times.

Figure 5:
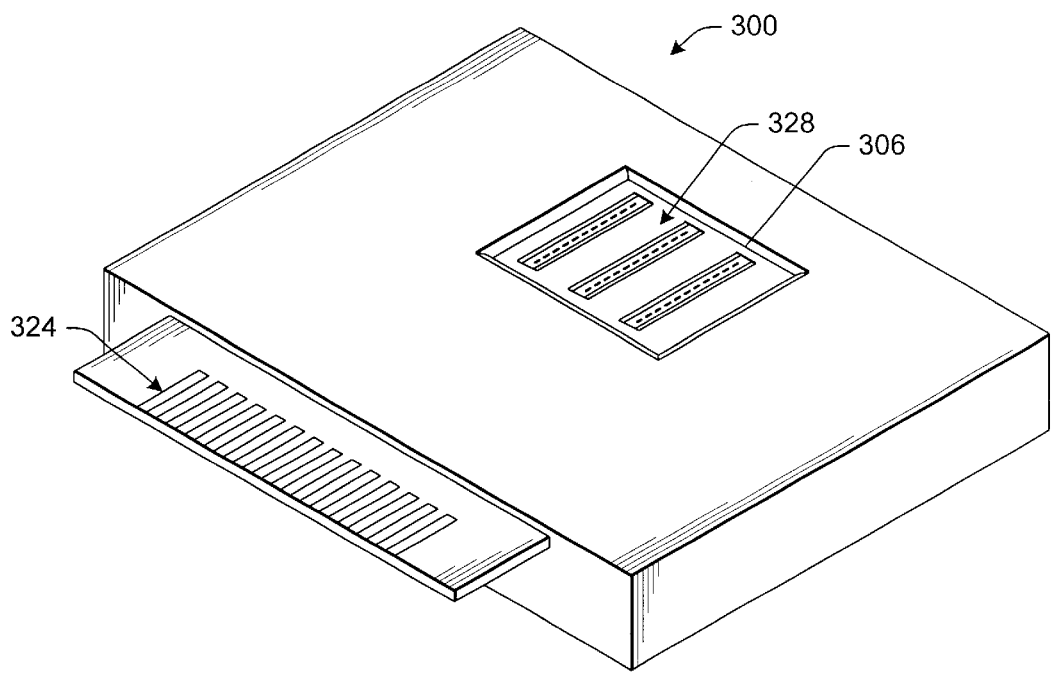
FIG. 5 is a perspective view in accordance with one exemplary embodiment.
Figure 6:
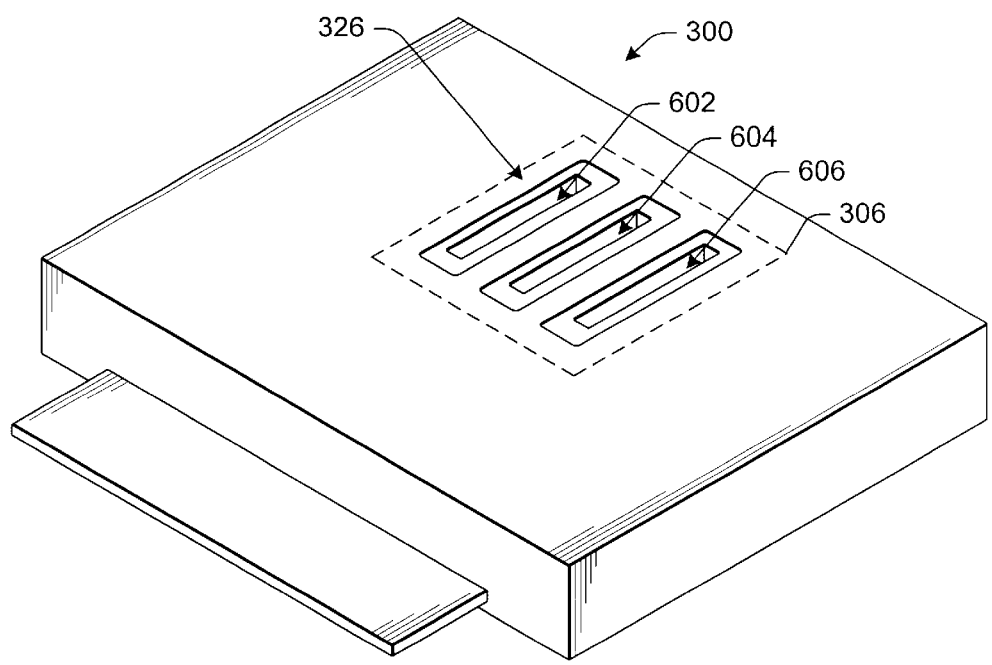
FIG. 6 is a perspective view in accordance with one exemplary embodiment.
Figure 7:
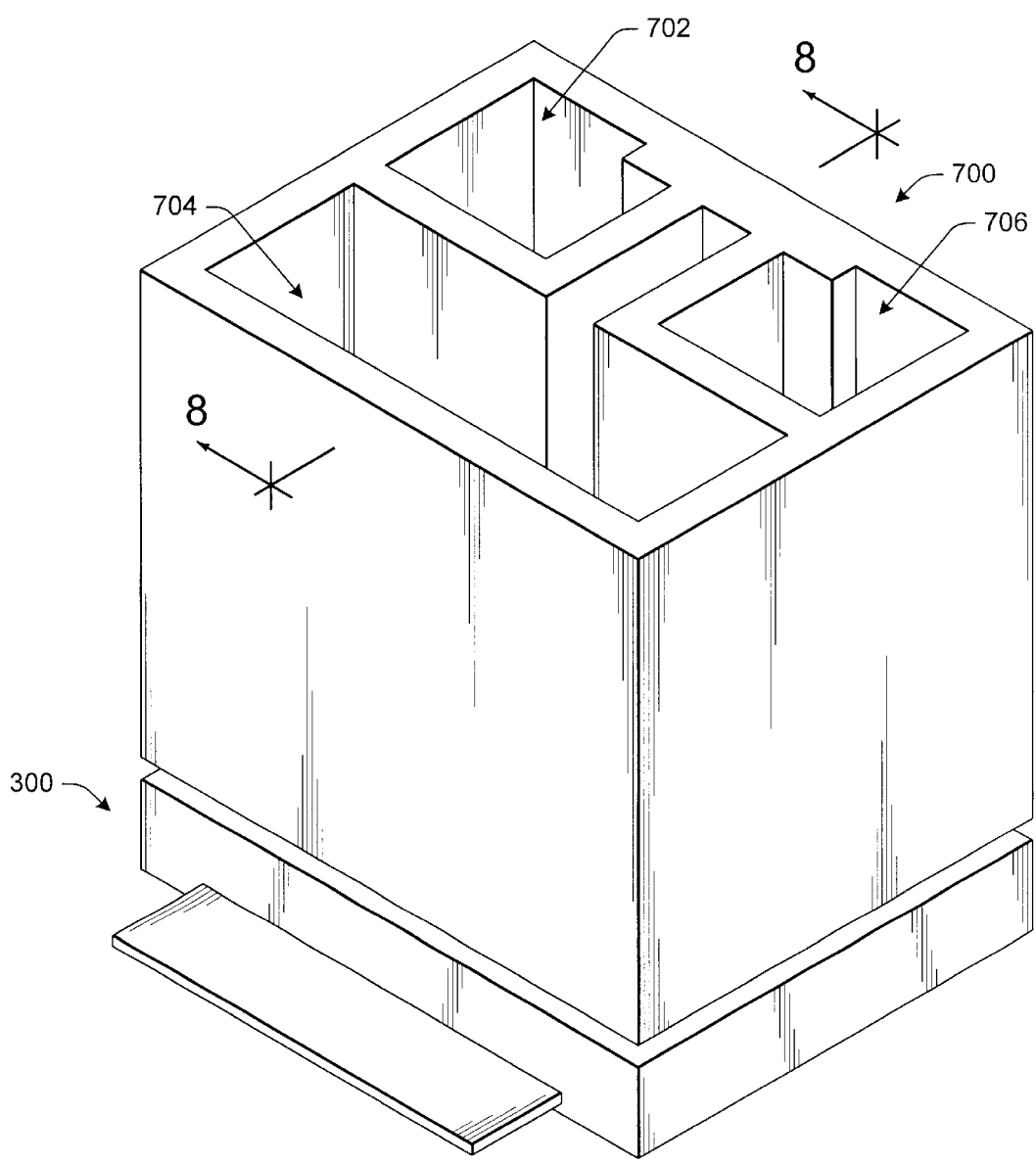
FIG. 7 is a perspective view in accordance with one exemplary embodiment.

FIG. 5 shows generally an interface area 328 of a die package 300. FIG. 6 shows generally the interface area 326 on the opposite side of this die package. The interface area 326 comprises three fluid receiving areas or regions (602, 604, and 606). This die package can be coupled to an ink supply 146 to become a portion of the print head 144 of a print cartridge 142. For example, FIG. 7 shows the die package 300, as shown in FIG. 6, combined with a fluid interface 700 at interface area 326 (shown FIG. 6). The fluid interface can comprise fluidic architecture for handling fluids. This can occur within a print cartridge to supply ink to a die where the die comprises a die assembly used in a print head. As can be seen from FIG. 7, the fluid interface provides three distinct ink paths (702, 704, and 706). The three paths can provide ink to the corresponding fluid receiving portions of the die 602, 604 and 606 (shown FIG. 6). Thus path 702 can provide ink to fluid receiving region 602, and similarly path 704 for 604 and 706 for 606. This can allow a die to print multiple colors or types of ink.

Figure 8:
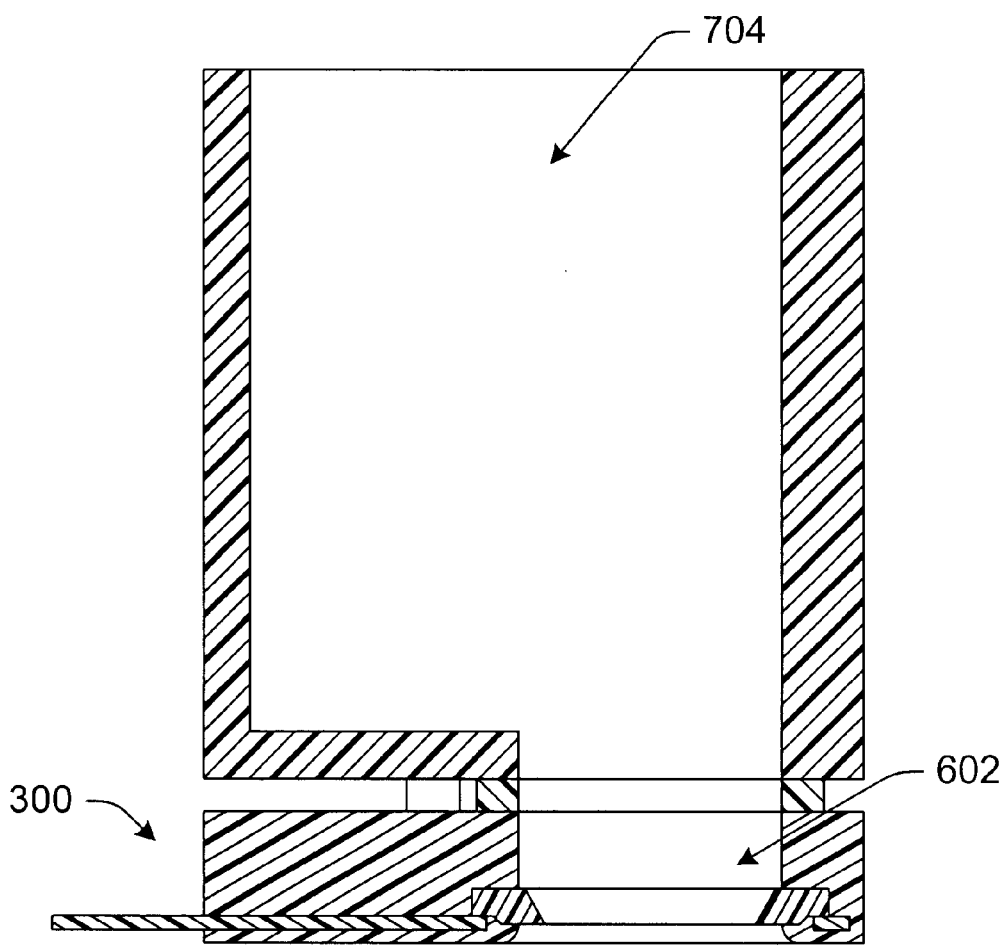
FIG. 8 is a cross-sectional view in accordance with one exemplary embodiment.

FIG. 8 shows a cross-section of FIG. 7 showing path 704 leading to fluid receiving region 604 of die package 300. FIGS. 7 and 8 show one way that these die packages can be combined with additional fluidic architecture to provide a portion of a print cartridge for use in a printer. Each of these embodiments can provide a die package with greater functional integrity and resistance to corrosion than could be achieved with existing technologies. Additionally, these embodiments can be cheaper and easier to make allowing for more components to be combined on a PCB than previous designs thus allowing for faster assembly at decreased cost.

In some exemplary embodiments, a printed circuit board ("PCB") can be coupled to another component within the die package without the use of expensive connectors such as flex, and since all the components and connectors can be contained within the insulative component they are protected from damage and corrosion. Further, the PCB and other components of the die assembly can be easily mass-produced in a configuration for a specific application. Further, the insulative component can provide structural integrity for the die assembly that it is molded around. This can allow the insulative component to be positioned or secured in a print cartridge or other device, thereby securely positioning or orienting the die package for printing without any direct contact to the die assembly.

The various embodiments can be made in many ways, some of which are described above and below. One exemplary way of making a die package is to contact one or more die assemblies with a tool on desired interface areas. A generally flowable insulative material can then be flowed or otherwise positioned around the die assemblies. Alternatively, a die assembly can be embedded into the flowable insulative material. The material can be one that can then become generally non-flowable. When the insulative material is in a non-flowable state it can provide electrical insulation and corrosion resistance to the areas of the die assembly that it surrounds. In one exemplary embodiment this process can be achieved with a mold or molding tool.

Figure 9:
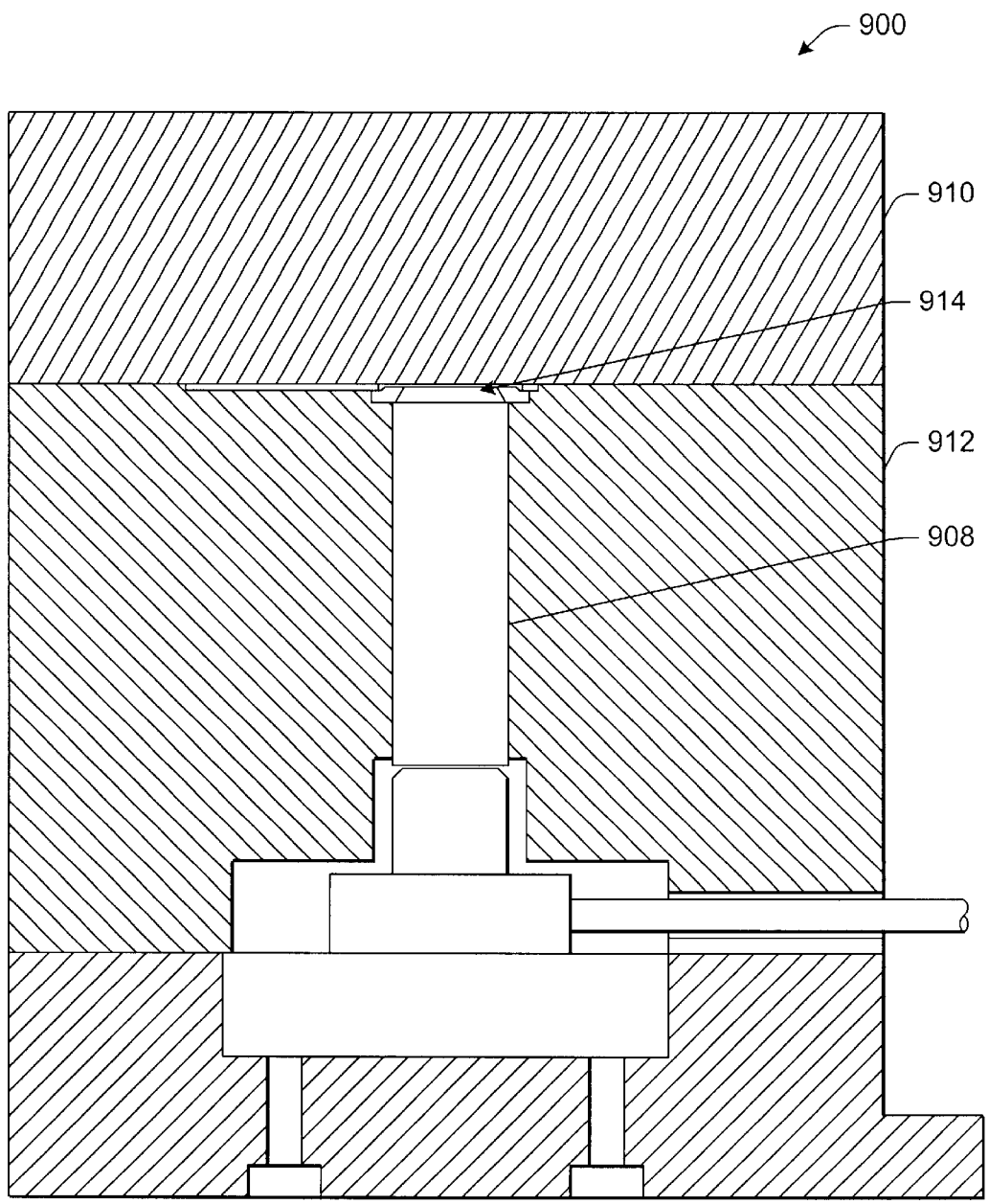
FIG. 9 is a cross-sectional view in accordance with one exemplary embodiment.

FIG. 9 shows an exemplary molding tool 900 that can define a cavity for containing a die assembly, and be configured to flow a generally flowable insulative material into the cavity. The molding tool can have a retractable toolhead 908 extending through the mold to the cavity. The toolhead can be configured to contact portions of a die assembly positioned in the mold on at least one area of the die assembly desired to be shut off from the flowable insulative material.

As shown in FIG. 9, the molding tool 900 can comprise a first portion 910 and a second portion 912. The two portions can be positioned relative to one another to define a cavity 914, and can be separable to allow positioning a die assembly in the cavity. The second portion can contain the retractable toolhead 908. In this exemplary embodiment, the toolhead can have a portion that extends into the cavity 914 for contacting a die assembly. The molding tool 900 further has an orifice (not shown) for injecting the flowable insulative material into the mold.

The contact between the toolhead and the die assembly can be on areas of the die assembly that are desired to be kept free of insulative material. These areas commonly comprise desired interface areas. The portion of the toolhead 908 that extends to the cavity can be configured to correspond to those areas.

Figure 10:
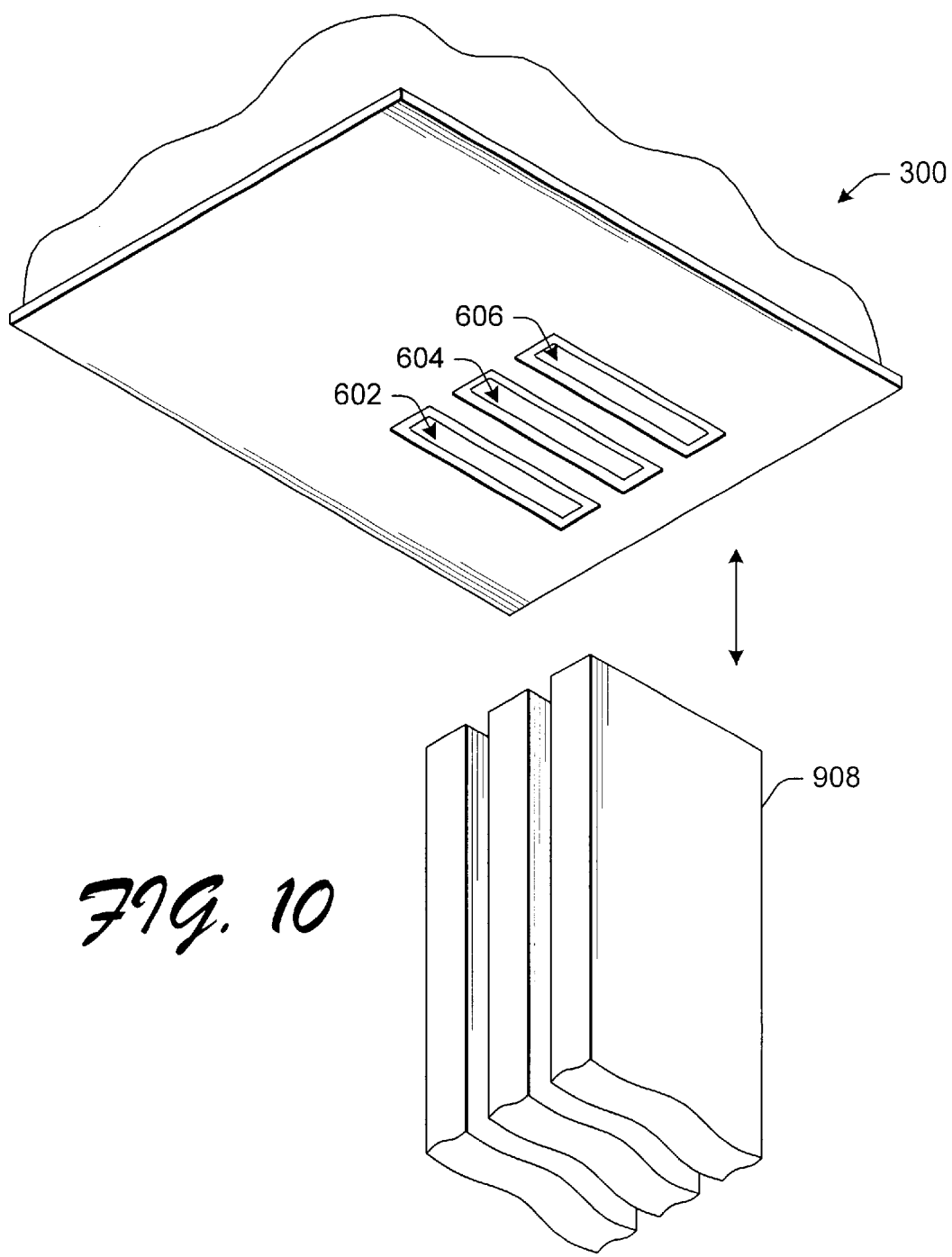
FIG. 10 is a perspective view in accordance with one exemplary embodiment.

FIG. 10 shows how the toolhead 908 can be so configured. Once the die assembly is positioned in the mold the toolhead can be raised to contact it. The toolhead can lift the die assembly upward and press the die assembly against a corresponding portion of the first section that has a shape that allows it to contact only those areas of the surface of the die assembly opposite the toolhead that are desired to be kept free of insulative material. These areas are then effectively "shut off" from insulative material. Other possible embodiments will be recognized. For example, in some embodiments, the toolhead can additionally have openings in the portion that touch the die assembly to which a vacuum can be applied. This vacuum can hold the die assembly in the desired orientation during the molding process. Some exemplary embodiments can have the vacuum feature combined with the contact from the toolhead and the first portion of the tool to further hold the die assembly during molding.

The die assembly can be supported or otherwise contacted on areas that are desired to be kept free from insulative materials. For example, in the embodiment shown in FIGS. 9 and 10, the toolhead and the first portion of the mold contact a die assembly on fluid interface areas of a die assembly. The toolhead can be configured to shut-off the ink receiving areas of the die assembly and the first portion can be configured to shut-off the ink ejecting regions of the die assembly.

The properties of the material used as the flowable insulative material should be evaluated in relation to the composition of the die assembly. For example, when a thermoplastic is utilized as the insulative component, the temperature of the injected insulative component should be compared to the melting point of solder and other materials used on the die assembly. Though some overlap between the temperature of the injected material and melting point of solder and other components can be acceptable because of cooling caused by the mass of the mold and the die assembly itself, degradation of the die assembly should be avoided.

In one exemplary embodiment, the die assembly can comprise a thermal ink jet die electrically connected to a PCB. A solder comprising Sn–3.5 Ag–0.7 Cu can be used on needed electrical connections. The assembly can be placed in the molding tool, so that the molding tool contacts desired interface areas of the die as described above. The generally flowing insulative component can comprise polyolefin that can be injected into the molding tool at about 350 to 400 degrees Fahrenheit.

For the purposes of illustration the die packages shown herein have been generally planar, however, an infinite variety of shapes can be created. For example, many print cartridges have an electrical interface region on a face or surface that is generally perpendicular to the print head. In some embodiments, this entire region can be made into a single die package. Also, some embodiments can include other materials and components into the die package. For example, in some embodiments it can be desirable to protect the die assembly from radio frequency (RF) and other radiation and radiation emitting devices.

In these embodiments, a shield can be incorporated into the die package in addition to the die assembly and the insulative component. This can be achieved by placing a shield, such as a lead foil into the mold with the die assembly and embedding the shield concurrently with the die assembly in the insulative component. Alternatively, shielding can be incorporated into a PCB that is subsequently used in a die assembly.

First Exemplary Method

Figure 11:
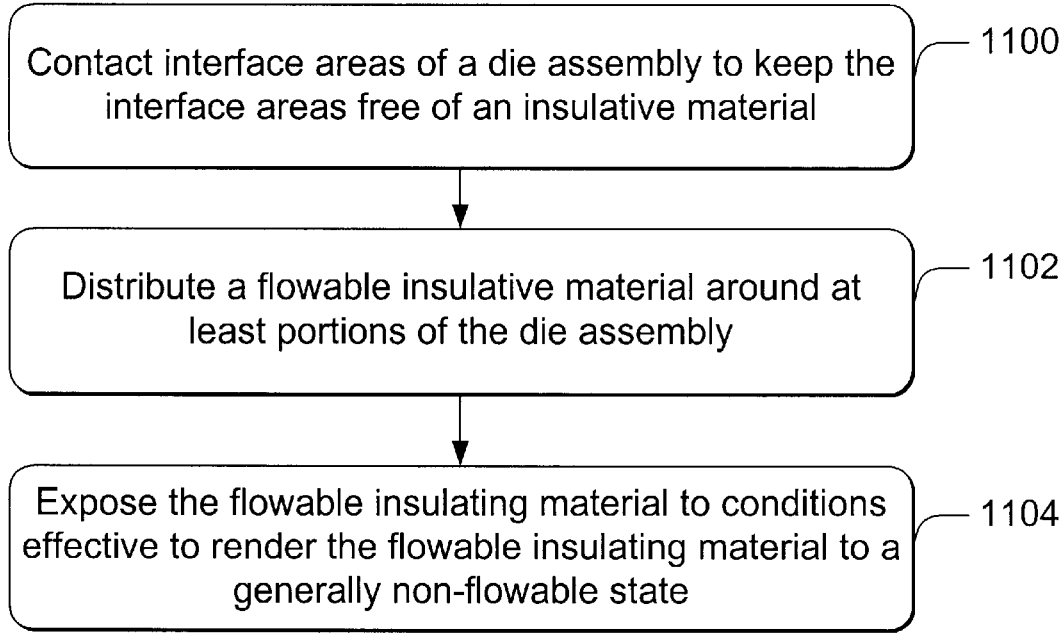
FIG. 11 is a flow chart showing steps in a method in accordance with one exemplary embodiment.

FIG. 11 shows steps in a method in accordance with one exemplary embodiment. Step 1100 contacts interface areas of a die assembly to keep the interface areas free of an insulative material. This can be achieved by contacting the die assembly with a tool. The tool can comprise a mold. The mold can be configured so that it only contacts those areas of the die assembly that are desired to be kept free of insulative material. One exemplary embodiment that illustrates this can be seen in FIGS. 9 and 10. The portion of the mold shown in FIG. 10 is the toolhead 908. In this embodiment, the toolhead is shaped to correspond to the areas of the die assembly that are desired to be free of insulative material. In FIG. 10, the three blocked or shut off areas can comprise ink interface areas for ejecting ink.

Step 1102 distributes a flowable insulative material around the die assembly. This can be achieved by introducing a flowable insulative material around the die assembly, by introducing the die assembly and tool into the insulative material, or by embedding portions of the die assembly in the flowable insulating material, among others. In some embodiments, where a mold is utilized, the flowable insulative material can be injected into the mold. Introducing the flowable insulative material into the mold under pressure can help to ensure even distribution of the insulative material around the areas desired to be covered with it.

The flowable insulative material need not be electrically insulative or provide corrosion resistance in its flowable form. Rather, these properties are associated with the generally non-flowable form. Suitable materials have been described above and include, but are not limited to various plastics, polyethylene, and other polymers.

Once the flowable insulative material has been distributed around the die, step 1104 can expose the flowable insulative material to conditions effective to render it to a generally non-flowable state. In some embodiments, the flowable insulative material comprises thermoplastic that has been heated sufficiently to allow it to flow. After distribution, the thermoplastic can be cooled sufficiently to become generally non-flowable. The cooling can be aided by flowing cool materials around the vicinity of the mold to speed the cooling process, or if the ambient environment is below the melting point of the thermoplastic the insulative material can be allowed to cool until it hardens or becomes generally non-flowable before removing the die package from the mold.

Other embodiments can use insulative materials that become non-flowable under other circumstances. For example, a plastic that hardens upon exposure to a given amount of exposure to UV light can be utilized. Other materials, such as some epoxies, do not require any affirmative actions, but instead will become generally non-flowable over a period of time. These are but a few of the ways to cause the flowable insulative material to become generally non-flowable. When the insulative material becomes generally non-flowable the die package can be removed from the tool or mold.

By utilizing the described embodiments, an essentially or functionally seamless insulative component can be achieved around the desired portions of the die assembly. The use of a mold for positioning the insulative component around the die assembly can of course create some superficial seams where portions of the mold meet. This superficial aspect need not affect the functional integrity of the insulative component that can provide effective corrosion resistance and electrical insulation to the die package.

Conclusion

The described embodiments can provide methods and systems for die packages. The die packages can utilize a die assembly that is at least partially embedded in or surrounded by an insulative component. The die assembly can be positioned in a tool that contacts areas that are desired to be kept free of the insulative component. The flowable insulative component can then flow around the die assembly, and after being converted to a generally non-flowable state it can protect the die assembly from corrosion and/or provide electrical insulation. This construction of a die package can more effectively protect the die assembly and any related connections. It can also allow the die assembly to be interconnected with simple inexpensive conductors that can be at least partially contained in the insulative component of the die package. It further allows the insulative component to seamlessly protect the die assembly while allowing desired interfaces to be made.

Although the invention has been described in language specific to structural features and methodological steps, it is to be understood that the invention defined in the appended claims is not necessarily limited to the specific features or steps described. Rather, the specific features and steps are disclosed as preferred forms of implementing the claimed invention.

What is claimed is:

1. A method of forming die packages, comprising:
    contacting interface areas of at least one die assembly;
    embedding at least portions of the at least one die assembly in an insulative material so that said interface areas remain free of the insulative material; and,
    embedding an RF shielding material in the insulative material.

2. A method of forming die packages, comprising:
    contacting interface areas of a die assembly to keep the interface areas free of an insulative material;
    distributing a flowable insulative material around at least portions of said die assembly; and,
    surrounding at least portions of said die assembly with an RF shielding material prior to said distributing.

* * * * *